(12) United States Patent
Cavins et al.

(10) Patent No.: US 7,342,833 B2
(45) Date of Patent: Mar. 11, 2008

(54) NONVOLATILE MEMORY CELL PROGRAMMING

(75) Inventors: Craig A. Cavins, Pflugerville, TX (US); Martin L. Niset, Austin, TX (US); Laureen H. Parker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 100 days.

(21) Appl. No.: 11/209,294

(22) Filed: Aug. 23, 2005

(65) Prior Publication Data

US 2007/0058434 A1    Mar. 15, 2007

(51) Int. Cl.
*G11C 16/04* (2006.01)

(52) U.S. Cl. ............ 365/185.28; 365/185.26; 365/185.19

(58) Field of Classification Search ........... 365/185.28, 365/185.26, 185.19
See application file for complete search history.

(56) References Cited

U.S. PATENT DOCUMENTS

| | | | |
|---|---|---|---|
| 3,553,947 A | 1/1971 | Root | 56/202 |
| 3,820,312 A | 6/1974 | Rombinson | 56/202 |
| 3,822,536 A | 7/1974 | Leader | 56/202 |
| 4,843,805 A | 7/1989 | Satoh | 56/202 |
| 6,353,556 B2 | 3/2002 | Chen et al. | |
| 6,738,289 B2 | 5/2004 | Gongwer et al. | |
| 6,882,567 B1* | 4/2005 | Wong | 365/185.03 |
| 2004/0109352 A1* | 6/2004 | Lee et al. | 365/185.2 |
| 2005/0038953 A1* | 2/2005 | Chang | 711/5 |
| 2005/0099846 A1* | 5/2005 | Chen et al. | 365/185.11 |

OTHER PUBLICATIONS

EP Search Report dated Dec. 19, 2006 from corresponding GB Appln. No. 0616221.8.

* cited by examiner

*Primary Examiner*—Thong Q. Le
(74) *Attorney, Agent, or Firm*—David G. Dolezal; James L. Clingan, Jr.

(57) ABSTRACT

A method for programming a non-volatile memory (NVM) cell includes applying an increasing voltage to the current electrode that is used as a source during a read. The initial programming source voltage results in a relatively small number of electrons being injected into the storage layer. Because of the relatively low initial voltage level, the vertical field across the gate dielectric is reduced. The subsequent elevation of the source voltage does not raise the vertical field significantly due to the electrons in the storage layer establishing a field that reduces the vertical field. With less damage to the gate dielectric during programming, the endurance of the NVM cell is improved.

20 Claims, 2 Drawing Sheets

NONVOLATILE MEMORY CELL PROGRAMMING

BACKGROUND OF THE INVENTION

1. Field of the Invention

This invention relates in general to non volatile memories and in particular to a method of programming non volatile memory cells.

2. Description of the Related Art

Non volatile memories (NVM) include memory cells for storing logical values with the values being retained after power has been removed from the memory.

Some types of NVM cells utilize a charge storing structure such as e.g. a floating gate for storing charge indicative of the logic value (or values with some types of NVM cells) being stored in the cell. With some types of NVM cells, the level of charge stored in the charge storing structure affects the voltage threshold of the transistor of the cell during a voltage read. In one example, a cell with a high voltage threshold would be considered as storing a logical "1" and a cell with a low voltage threshold would be considered as storing a logical "0". Conventional memory circuitry (e.g. a sense amplifier) can be used during a read of a memory cell to differentiate between a high voltage threshold and low voltage threshold due to the charge level stored in the charge storing structure of a memory cell.

Logical values are stored in a memory cell by adding charge to the charge storing structure. In one example of writing values to a NVM, all of the cells of the NVM are first erased. Then cells in which a logic value (e.g. a logical 1) is to be stored would be programmed by adding charge to the charge storing structure of the cell. No charge would be added to cells in which another logic value (e.g. a logical 0) is desired to be stored. Thus, the charge storing structures of these cells would remain at the erased charge level.

One type of programming an NVM cell is generally referred to as hot carrier injection. With hot carrier injection, a current electrode (e.g. source or drain) of an NVM memory cell is biased with a relatively high voltage and a biasing gate (e.g., select gate or control gate) is biased with a relative high voltage. The other current electrode (e.g. the other of the source or drain) is coupled to a current source or a relatively low voltage. Under such conditions, electrons move to the biased current electrode across a channel region, and electrons are injected into the charge storing structure to charge the charge storing structure.

One problem with conventional hot carrier injection programming is that it can damage the NVM cells ability to store logical values. Accordingly, the number of times that a cell may be programmed and still remain operational may be limited.

What is needed is an improved method for programming a non volatile memory cell.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
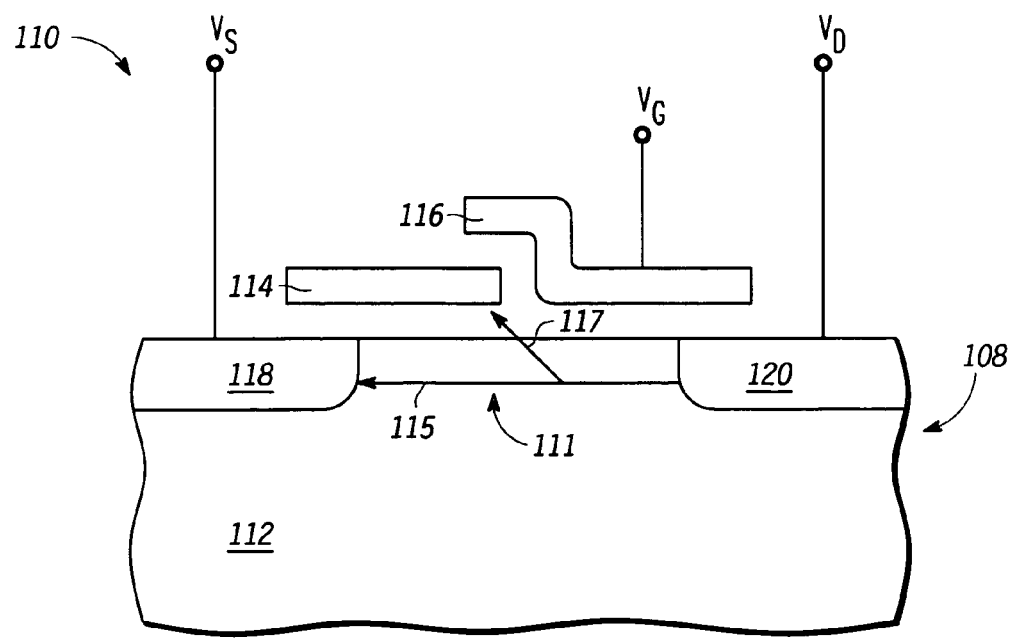
FIG. 1 is a partial side view of one type of non volatile memory cell.
Figure 2:
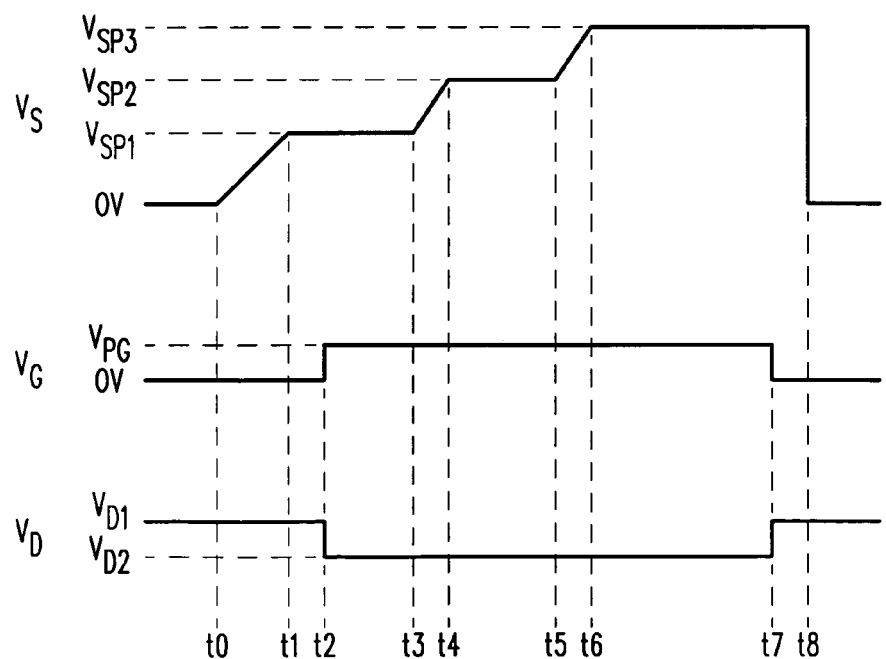
FIG. 2 is a timing diagram for programming a non volatile memory cell according to one embodiment of the present invention.
Figure 3:
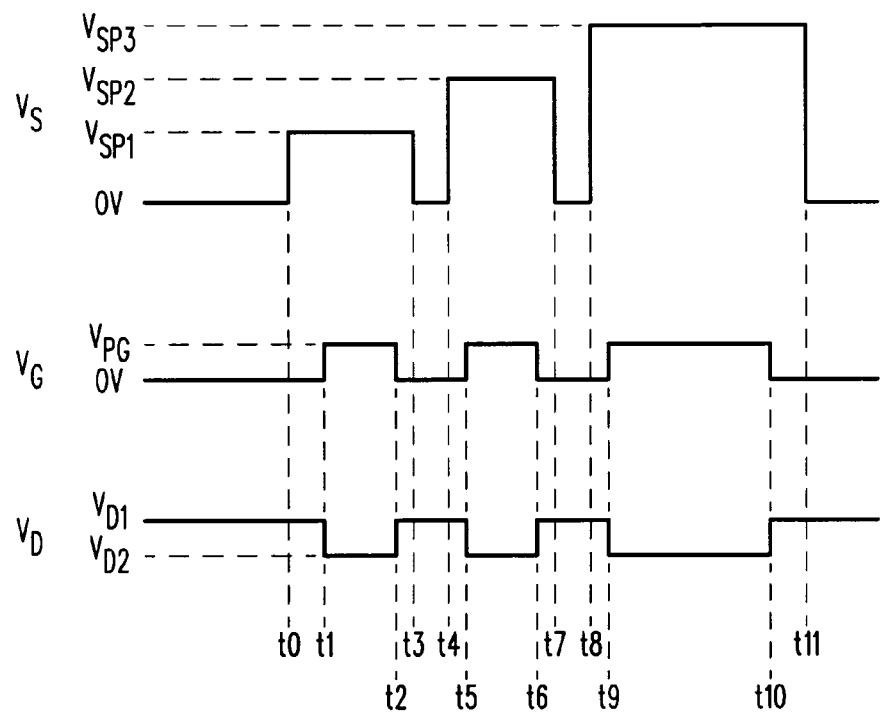
FIG. 3 is a timing diagram for programming a non volatile memory cell according to another embodiment of the present invention.

FIG. 1 is a partial side view of one example of a non volatile memory cell 110 that may be programmed according to the embodiments set forth in the timing diagrams of FIGS. 2 and 3. In the embodiment shown, memory cell 110 is a NVM cell implemented in a non volatile memory array (not shown) of an integrated circuit 108. In one embodiment, the memory array may be a stand alone memory circuit. In other embodiments, the memory array may be implemented with a processor (not shown) or with other types of circuitry in an integrated circuit.

In the embodiment shown, memory cell 110 is a split gate memory cell with a charge storing structure 114 (e.g. floating gate) separated from substrate 112 by dielectric material (not shown in FIG. 1). Cell 110 also includes a select gate 116 having a portion separated from charge storing structure 114 by dielectric material and a portion separated from substrate 112 by dielectric material. In one embodiment, gate 116 may extend farther (to the left in the view of FIG. 1) over charge storing structure 114 and be used as a control gate. Cell 110 includes a drain 120 and a source 118, both of which are located in substrate 112 in the embodiment shown. In one embodiment, source 118 and drain 120 are formed by doping areas of substrate 112. Memory cell 110 may include other conventional structures or features not shown such as e.g. sidewall spacers, silicided contacts, barrier layers, plugs, and/or interlayer dielectrics.

In one embodiment, select gate 116 and charge storing structure 114 are implemented with doped poly silicon, but each may be made of different materials in other embodiments. In one embodiment, gate 116 and/or charge storing structure 114 may be made of metal or other conductive materials. In other embodiments, charge storing structure 114 may be made of a charge trapping dielectric such as e.g. nitride or hafnium oxide. In other embodiments, charge storing structure 114 may include nanocrystals or other charge storing material. In one embodiment, charge storing structure may include a geometric shape (e.g. a pointed region or curved region) that enhances the electric field for removal of electrons during erase operations.

In the embodiment shown, select gate 116 is electrically coupled to a word line (not shown) of the memory array, drain 120 is electrically coupled to a bit line (not shown) of the memory array, source 118 is electrically coupled to a source line (not shown) of the memory array. In one embodiment, these lines are implemented in interconnect layers above the substrate 112 and are coupled to conventional circuitry (e.g. line drivers, sense amplifiers) for applying voltages to these structures or measuring current or voltages from these structures during memory array operations. The details of such circuitry are known to those of skill in art and are omitted from the Figures to more clearly represent programming features of this application.

In the embodiment shown, memory cell 110 is a 1-bit NVM cell which stores only one logical bit. However, other memory cells may store a different number of values. In the embodiment shown, charge is stored in charge storing structure 114 to store a one bit logical value in memory cell 110. In the embodiment shown, the more negative charge stored in charge storing structure 114, the higher the voltage threshold of memory cell 110 when read.

To read the logical value stored in cell 110, a read voltage ($V_{DR}$) is applied to drain 120 (as shown by terminal $V_D$ in FIG. 1) and a read voltage ($V_{GR}$) is applied to gate 116 to select the cell. A sense amplifier or other sensing circuitry is coupled to the drain during a read operation. The sense amplifier is used to differentiate between a first voltage threshold due to a first level of charge stored in charge storing structure 114 and a second voltage threshold due to a second level of charge stored in charge storing structure 114.

Memory cell 110 is programmed by selectively adding or injecting charge into charge storing structure 114 to store a particular logic value. The injected charge in charge storing structure 114 provides memory cell 110 with a voltage threshold above a predetermined voltage threshold level when read.

An example of a type of programming that may be used to inject charge into charge storing structure 114 is referred to as source side injection. With source side injection, a programming voltage ($V_{PS}$) is applied to source 118 and a programming voltage ($V_{PG}$) is applied to select gate 116. In some embodiment, drain 120 is coupled to a current source or voltage source during programming.

As shown in FIG. 1, during programming, electrons are injected from drain 120 across channel region 111 to source 118 (see arrow 115). Also during programming, electrons are injected into charge storing structure 114 from drain 120 due to the vertical field generated by the source programming voltage ($V_{SP}$) capacitively coupled to charge storing structure 114 in the embodiment shown.

However, source side injection programming creates damage in memory cell 110 which reduces the memory cell's ability to provide a voltage threshold that is dependent upon the amount of charge stored in charge storing structure 114 or the ability to store charge in charge storing structure 114. Accordingly, NVM cells can be programmed a limited number of times. Such limited programming decreases the flexibility of use of an integrated circuit implementing memory cell 110.

FIG. 2 sets forth a timing diagram of one embodiment for programming a NVM cell with source side injection according to one embodiment of the present invention. In the embodiment shown in FIG. 2, a programming voltage is initially applied to source 118 at a lower level and then increased over the programming cycle.

At time t0, a voltage is applied to source 118 and ramps up to a first voltage level ($V_{SP1}$) at time t1. At time t2, a programming voltage ($V_{PG}$) is applied to select gate 116, and drain 120 is placed in a condition to pull current from drain 120 thereby reducing its potential from $V_{D1}$ to $V_{D2}$. In one embodiment, drain 120 is placed in a condition to pull current by electrically coupling a bit line to a current mirror (not shown).

From time t2 to time t3, the voltage applied to source 118 remains at $V_{SP1}$. At time t3, the voltage applied at source 118 begins to ramp up until it reaches $V_{SP2}$ at time t4. The voltage applied to source 118 remains at $V_{SP2}$ until time t5, where it begins to ramp up until its reaches voltage $V_{SP3}$ at time t6. From time t6 to time t7, charge storing structure 114 is being programmed with voltage $V_{SP3}$ being applied to source 118. At time t7, the cell is deselected by, in the embodiment shown, removing the programming voltage from gate 116. Also at time t7, drain 120 is removed from the condition where a current is pulled from drain 120 wherein the voltage of drain 120 moves back from $V_{D2}$ to $V_{D1}$. At time t8, the voltage of source 118 is brought down to 0V.

In one embodiment, $V_{PS1}$ is 7 Volts, $V_{PS2}$ is 8.5 Volts, $V_{PS3}$ is 10.5 Volts, $V_{PG}$ is 2 Volts, $V_{D1}$ is 2.5 volts, and $V_{D2}$ is 0.7 volts. In one embodiment, the time from time t2 to time t3 is 3 microseconds, the time t3 to time t5 is 4 microseconds, and the time from time t5 to time t7 is 15 microseconds with the total time from time t0 to time t8 being less than 40 microseconds. However, other embodiments may utilize other programming voltages and/or times.

During programming, the vertical field from the charge storing structure 114 to substrate 112 is a function of the charge of the charge storing structure 114 plus the source voltage ($V_S$). Initially, for an erased memory cell, charge storing structure 114 is at a higher potential due to the absence of electrons from being at an erased state. As electrons are injected into charge storing structure 114, the positive charge of gate 114 is reduced and therefore the total field is reduced as the programming cycle progresses.

In the embodiment shown, programming during a program cycle is performed with the source voltage being raised as the program cycle progresses. Because early in the programming cycle, the source voltage is at a lower level (e.g. $V_{SP1}$), the vertical field between the charge storing structure 114 and substrate 112 is lower during the earlier portions of the programming cycle.

If $V_{SP3}$ were initially applied to source 118 at the beginning of the programming cycle, then the vertical field would be at a maximum due to the charge storing structure being at its maximum positive charge (the erased state) and the source being at a maximum voltage level simultaneously.

However, with the embodiment shown in FIG. 2, with a lower voltage initially applied to source 118, the vertical field is reduced during the initial portion of the programming cycle. As charge is injected into charge storing structure 114, the positive charge of charge storing structure 114 is reduced thereby reducing the vertical field. As the vertical field falls, the source voltage can be raised. When the voltage is raised to $V_{SP2}$, more charge is injected into charge storing structure 114, thereby reducing the vertical field further. Accordingly, by the time that the highest source voltage $V_{SP3}$ is applied, the positive charge of the charge storing structure 114 has been reduced such that the vertical field is significantly less than if $V_{SP3}$ where initially applied during a programming cycle.

With some types of NVM cells, a high vertical filed during programming causes damage to the cell's gate dielectric thereby affecting the cell's ability to store logical values. Because the vertical field is reduced due to an initial lower source voltage of a programming cycle with the embodiments described, the amount of damage that occurs during a programming cycle due to the vertical field is reduced as well. Due to this reduced damage, a memory cell may be able to withstand more programming cycles and maintain operability.

In other embodiments, the voltages applied to the gate and the source and their duration may be different. For example, in one embodiment, the voltage applied to the source may be a continuous linear ramp function from 0V to the maximum programming source voltage. In other embodiments, the ramp may have a non linear function (e.g. parabolic). Other embodiments may have a different number of source programming voltage levels e.g. just 2 ($V_{SP1}$ and $V_{SP2}$) or four or greater. In the embodiment shown, the source remains at the highest voltage ($V_{SP3}$ in FIG. 2) for the longest period of time (e.g. when the bulk of programming is being performed). However, in other embodiments, the source voltage may remain at a fixed lower voltage level for a longer period of time than at the higher voltage level.

Also, in other embodiments, a read cycle of the memory cell may be performed after time t8 to test the cell to see if it's programmed properly. If the cell does not read correctly, then another programming cycle may be performed.

FIG. 3 is a timing diagram of another embodiment of a programming cycle for programming an NVM cell according to the present invention. The embodiment of FIG. 3 is different from the embodiment of FIG. 2 in that the source voltage is increased during the programming cycle in a step wise and discontinuous manner. For example, at time t0, the voltage is increased to $V_{SP1}$ from 0 voltage and then reduced from $V_{SP1}$ to 0V at time t3. The next increase in the source voltage ($V_{SP2}$) occurs from time t4 to time t7. During the time that the source voltage is reduced to 0 volts (e.g. time t3 to time t4 and time t7 to time t8), the cell is deselected. In the embodiment shown, cell 110 is deselected by applying 0 volts to gate 116 (e.g. from time t2 to time t5 and time t6 to time t9).

In the embodiment of FIG. 3, the cell is deselected during a change in source voltage. Accordingly, if a voltage overshoot occurs, the increase in the vertical field due to the excess voltage of the overshoot will not damage the cell in that the cell is deselected.

The embodiment of FIG. 2 may be modified such that the cell may be deselected before the ramp or during the ramp to voltage levels $V_{SP1}$, $V_{SP2}$, and/or $V_{SP3}$ so that the cell is de-asserted at the end of the ramp when an overshoot may occur. Also in some embodiments, the source voltage may be stepped to the next higher voltage without being brought to zero volts as shown in the embodiment of FIG. 3.

One advantage of the programming cycles of FIGS. 2 and 3 is that the programming cycles are uninterruptible in that there are no intermittent read operations in between the increases in source voltage.

The use of increasing voltages applied to the source during programming may be utilized in other types of NVM cells.

Figure 4:
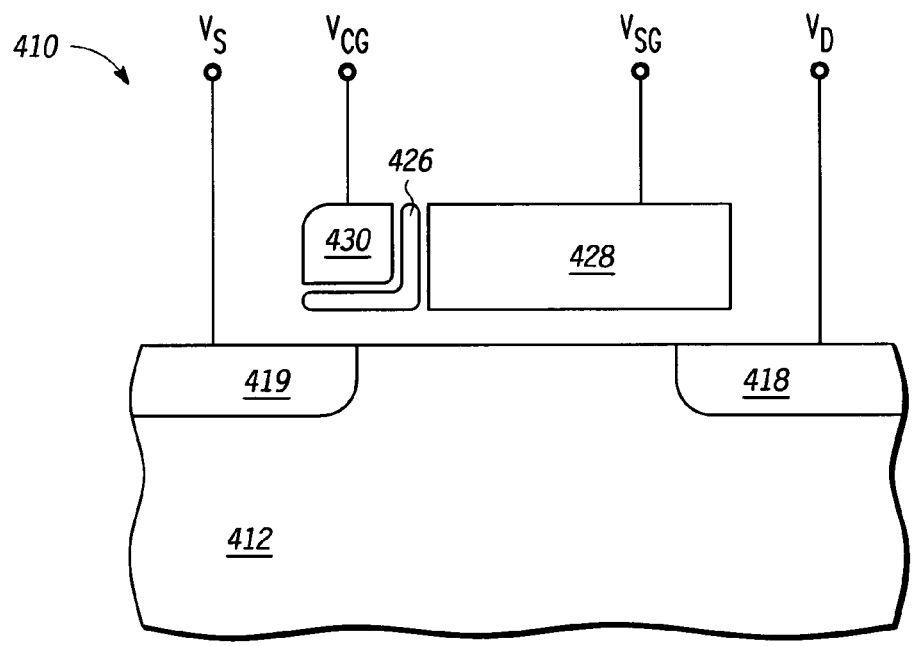
FIG. 4 is a partial side view of another type of non volatile memory cell.

FIG. 4 is a partial side view of another type of NVM cell. NVM cell 410 includes two biasing gates, a control gate 430 and a select gate 428. Cell 410 includes a nitride charge storing structure 426. Structure 426, gate 428, and gate 430 are located over substrate 412. Cell 410 includes both a source 419 and a drain 418.

To program cell 410 and inject charge into structure 426, a source program voltage is applied to source 419, a program voltage is applied to the control gate 430, a program voltage is applied to select gate 428, and a lower voltage is applied to drain 418. With this embodiment, the voltage applied to the source may be increased during programming. In some embodiments, the programming voltage applied to gate 430 may be increased during programming as well.

As described herein, the term source designates a current electrode of a memory cell that supplies carriers (e.g. electrons for N-channel devices or holes for P-channel devices) during a read of a storage location of the memory cell. A drain is a current electrode of a memory cell that receives the carriers during a read of a storage location of the memory cell. Some NVM's may have more than one storage location, accordingly, the designation of source or drain of a current electrode of a memory cell would depend upon which storage location is being read during a read. Thus, the designation of source or drain to a current electrode during a write of a storage location of a multi storage location cell would depend upon its use during a read of the storage location.

One embodiment includes a method of programming a non-volatile memory (NVM) cell that includes a first current electrode that functions as a source during a read operation, a second current electrode that functions as a drain during a read operation, and a control electrode that functions as a biasing gate. The method includes applying a first programming voltage to the first current electrode and applying a second programming voltage to the first current electrode after the applying the first programming voltage. The second programming voltage is greater than the first programming voltage. The method also includes applying a programming voltage to the control electrode during the step of applying the first programming voltage and applying a programming voltage to the control electrode during the step of applying the second programming voltage. In a further embodiment, the applying the first programming voltage is characterized as being performed by ramping up to the first programming voltage. In a further embodiment, the applying the second programming voltage is further characterized as being performed by ramping from the first programming voltage to the second programming voltage. In a further embodiment, the first programming voltage is applied for a first time duration, and the second programming voltage is applied for a second time duration. In a further embodiment, the second time duration is longer than the first time duration. In a further embodiment, the NVM cell is deselected between the applying the first programming voltage and the applying the second programming voltage. In a further embodiment, the first programming voltage and the second programming voltage are greater than a voltage applied to the control electrode during the step of applying a first programming voltage to the first current electrode and the step of applying a second programming voltage to the first current electrode. In a further embodiment, the second current electrode is at a third voltage before the step of applying a first programming voltage to the first current electrode, the second current electrode is at a voltage different than the third voltage during the step applying a first programming voltage to the first current electrode, and the second current electrode is at a voltage different than the third voltage during the step applying a second programming voltage to the first current electrode. In a further embodiment, the applying the second programming voltage uninterruptibly follows from the applying the first programming voltage. In a further embodiment, the method further includes applying a third programming voltage to the first current electrode after the applying the first programming voltage, wherein the third programming voltage is greater than the second programming voltage. In a further embodiment, the applying the third programming voltage is further characterized as being performed by ramping from the second programming voltage to the third programming voltage. In a further embodiment, the applying the third programming voltage uninterruptibly follows from the applying the second programming voltage. In a further embodiment, the first programming voltage is applied for a first time duration, the second programming voltage is applied for a second time duration, and the third programming voltage is applied for a third time duration. In a further embodiment, the third time duration is longer than the first time duration and the third time duration is longer than the second time duration. In a further embodiment, the method further includes deselecting the NVM cell between the applying the second programming voltage and the applying the third programming voltage. In a further embodiment, the NVM cell has a storage layer selected from the group consisting of a metal layer, a polysilicon layer, a layer of nanocrystals, and a charge storing dielectric layer. In a further embodiment, the applying a first programming voltage to the first current electrode and the applying a second programming voltage to the first current electrode is further characterized as being performed by ramping through the first programming voltage to the second programming voltage.

Another embodiment includes a method of programming a non-volatile memory (NVM) cell that includes a biasing gate, a source, and a drain for reading the NVM cell. The method includes applying a first voltage to the source for a first time duration, and after the applying the first voltage and before performing a read of the NVM cell, applying a second voltage to the source for a second time duration. The second voltage is greater than the first voltage. The method includes after applying the second voltage and before performing a read of the NVM cells, applying a third voltage to the source for a third time duration. The third voltage is greater than the second voltage. In a further embodiment, the third time duration is longer than the first time duration and the third time duration is longer than the second time duration.

Another embodiment includes a method for programming an NVM cell including a biasing gate, a source, and a drain for reading. The method includes an uninterruptible portion that includes applying a first voltage to the source and applying a second voltage to the source. The second voltage is greater than the first voltage. The uninterruptible portion further includes applying a third voltage to the source. The third voltage is greater than the second voltage. The method also includes applying a voltage to the biasing gate during the applying the first voltage to the source, applying a voltage to the biasing gate during the applying the second voltage to the source, and applying a voltage to the biasing gate during the applying the third voltage to the source.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of programming a non-volatile memory (NVM) cell that includes a first current electrode that functions as a source during a read operation, a second current electrode that functions as a drain during a read operation, and a control electrode that functions as a biasing gate, the method comprising:
   applying a first programming voltage to the first current electrode;
   applying a second programming voltage to the first current electrode after the applying the first programming voltage, wherein the second programming voltage is greater than the first programming voltage; and
   applying a programming voltage to the control electrode during the step of applying the first programming voltage and applying a programming voltage to the control electrode during the step of applying the second programming voltage.

2. The method of claim 1, wherein the applying the first programming voltage is characterized as being performed by ramping up to the first programming voltage.

3. The method of claim 2, wherein the applying the second programming voltage is further characterized as being performed by ramping from the first programming voltage to the second programming voltage.

4. The method of claim 1, wherein:
   the first programming voltage is applied for a first time duration; and
   the second programming voltage is applied for a second time duration.

5. The method of claim 4 wherein the second time duration is longer than the first time duration.

6. The method of claim 1, wherein the NVM cell is selected during the applying a programming voltage to the control electrode, wherein the NVM cell is deselected between the applying the first programming voltage and the applying the second programming voltage.

7. The method of claim 1, wherein the first programming voltage and the second programming voltage are greater than a voltage applied to the control electrode during the step of applying a first programming voltage to the first current electrode and the step of applying a second programming voltage to the first current electrode.

8. The method of claim 1 wherein:
   the second current electrode is at a third voltage before the step of applying a first programming voltage to the first current electrode;
   the second current electrode is at a voltage different than the third voltage during the step applying a first programming voltage to the first current electrode;
   the second current electrode is at a voltage different than the third voltage during the step applying a second programming voltage to the first current electrode.

9. The method of claim 1, wherein the applying the second programming voltage uninterruptibly follows from the applying the first programming voltage.

10. The method of claim 1, further comprising applying a third programming voltage to the first current electrode after the applying the first programming voltage, wherein the third programming voltage is greater than the second programming voltage.

11. The method of claim 10, wherein the applying the third programming voltage is further characterized as being performed by ramping from the second programming voltage to the third programming voltage.

12. The method of claim 10, wherein the applying the third programming voltage uninterruptibly follows from the applying the second programming voltage.

13. The method of claim 10, wherein:
   the first programming voltage is applied for a first time duration;
   the second programming voltage is applied for a second time duration;
   the third programming voltage is applied for a third time duration.

14. The method of claim 13 wherein the third time duration is longer than the first time duration and the third time duration is longer than the second time duration.

15. The method of claim 10, further comprising:
   deselecting the NVM cell between the applying the second programming voltage and the applying the third programming voltage.

16. The method of claim 1, wherein the NVM cell has a storage layer selected from the group consisting of a metal layer, a polysilicon layer, a layer of nanocrystals, and a charge storing dielectric layer.

17. The method of claim 1 wherein the applying a first programming voltage to the first current electrode and the applying a second programming voltage to the first current electrode is further characterized as being performed by ramping through the first programming voltage to the second programming voltage.

18. A method of programming a non-volatile memory (NVM) cell that includes a biasing gate, a source, and a drain for reading the NVM cell, the method comprising:

applying a first voltage to the source for a first time duration;

after the applying the first voltage and before performing a read of the NVM cell, applying a second voltage to the source for a second time duration, wherein the second voltage is greater than the first voltage; and after applying the second voltage and before performing a read of the NVM cells, applying a third voltage to the source for a third time duration, wherein the third voltage is greater than the second voltage.

19. The method of claim 18 wherein the third time duration is longer than the first time duration and the third time duration is longer than the second time duration.

20. A method for programming an NVM cell including a biasing gate, a source, and a drain for reading, the method including an uninterruptible portion comprising:

applying a first voltage to the source;

applying a second voltage to the source, wherein the second voltage is greater than the first voltage;

applying a third voltage to the source, wherein the third voltage is greater than the second voltage; and applying a voltage to the biasing gate during the applying the first voltage to the source, applying a voltage to the biasing gate during the applying the second voltage to the source, and applying a voltage to the biasing gate during the applying the third voltage to the source.

* * * * *